Figure 1:
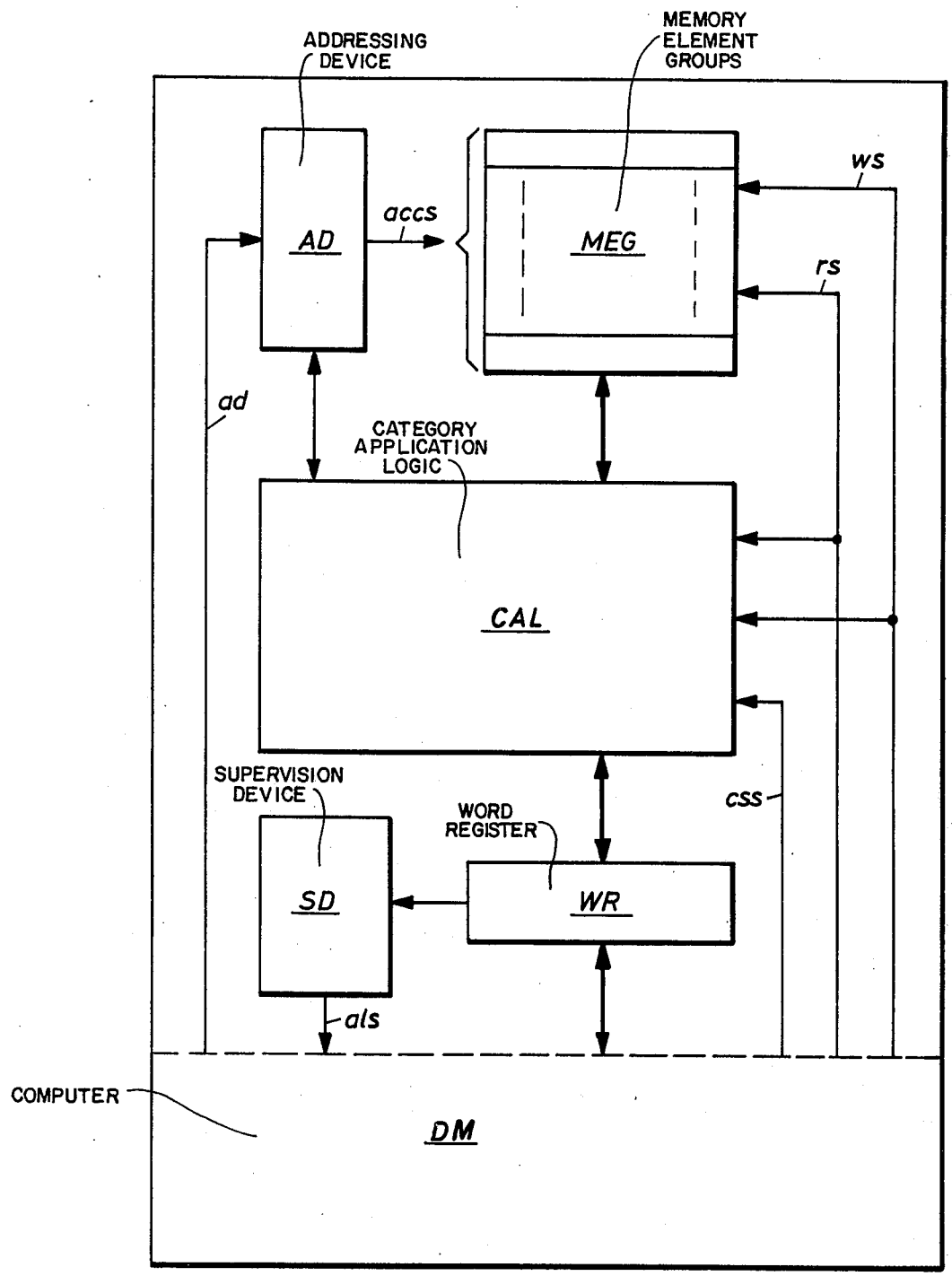

United States Patent [19]
Jonsson et al.

[11] 4,075,466
[45] Feb. 21, 1978

[54] METHOD OF AND ARRANGEMENT FOR DETECTING FAULTS IN A MEMORY DEVICE

[75] Inventors: Björn Erik Rutger Jonsson, Järfälla; Ulf Ivan Gunnar Andersson, Bandhagen; Gustav Ruben Bergman, Alvsjo, all of Sweden

[73] Assignee: Telefonaktiebolaget L M Ericsson, Stockholm, Sweden

[21] Appl. No.: 718,839

[22] Filed: Aug. 30, 1976

[30] Foreign Application Priority Data
Sept. 16, 1975 Sweden .................................. 7510332

[51] Int. Cl.² ............................................ G11C 29/00
[52] U.S. Cl. ................................................. 235/302.3
[58] Field of Search ................. 340/146.1 BA, 173 R; 235/312, 302.3; 364/900

[56] References Cited
U.S. PATENT DOCUMENTS

| | | | |
|---|---|---|---|
| 3,336,579 | 8/1967 | Heymann | 235/153 AC |
| 3,576,982 | 5/1971 | Duke | 235/153 AM |
| 3,727,039 | 4/1973 | Baker et al. | 235/153 AC |
| 3,768,071 | 10/1973 | Knauft et al. | 235/153 AM |
| 3,898,449 | 8/1975 | Sanabria | 235/153 AC |
| 3,972,033 | 7/1976 | Cislaghi et al. | 235/153 AM |

*Primary Examiner*—Charles E. Atkinson
*Attorney, Agent, or Firm*—Hane, Roberts, Spiecens & Cohen

[57] ABSTRACT

A method and an arrangement is provided for detecting a faulty memory element among a plurality of memory elements. Two element categories are introduced. If a memory element belongs to the first category normal writing and reading processes are carried out. If a memory element belongs to the second category the writing processes as well as the reading processes are combined with an inversion a (binary complementing) of the actual transferred binary information. The category of an element is shifted at times, for example, before each writing process.

6 Claims, 4 Drawing Figures

METHOD OF AND ARRANGEMENT FOR DETECTING FAULTS IN A MEMORY DEVICE

The present invention relates to a method of detecting faults in a memory device which contains addressable memory element groups storing binary coded information words and a word register in order to register the information words transferred during a writing and a reading phase respectively between the word register and the addressed element group. Furthermore, the invention relates to a logical arrangement for performing the method, i.e., a so called category application logic which is a part of a computer.

Memory devices are well known computer peripherals containing bi-stable elements, for example, magnetic cores which are brought to stable positive and negative magnetic remanence states of saturation due to re-magnetizations. Instead of magnetic core memories, dynamic and static semiconductor memories are now often used, the elements of which consist of capacitors and transistor flip-flops respectively. Every capacitor is brought to either a charged or a discharged state. Strictly speaking, it is only the discharged state which is defined as stable, as such capacitors discharge themselves rather quickly, and therefore the charged state must be refreshed at convenient time intervals in order to receive a bi-stable condition.

A memory element is faulty on the one hand, when its state can not be defined without hesitation, either as a binary "1" or as a binary "0", and on the other hand, if it is impossible to shift from an unambiguously defined first state to the second state. The present invention deals with the latter type of fault which appears in a core memory if applied re-magnetizing pulses do not result in a change of the remanence state, and which appears in a dynamic semiconductor memory if applied voltages do not result in a charged state which lasts for the entire refresh-time interval. Thus, from a memory element impaired by such a fault, the same binary state is read irrespective of which of the two states has been supplied to the element during a writing operation. Possibly, correct information is read, though there is a fault, consequently called a hidden fault.

A known method of detecting faults in memory devices, is to use test routines executed in addition to the actual operation of the computer to control a process when the respective memory parts are in a stand-by condition wherein the information stored during the test routine is completely unrelated to the information necessary for the process control, for which executive memory regions are used. Such test routines demand time and extra programming and storage equipment, but can be executed so that even hidden faults are detected.

Another known method of detecting faults in memory devices is by introducing a parity bit in every information word, a fault being detected if existing parity demands are not fulfilled. Another known fault detecting method is the comparing information words which appear simultaneously in parallel synchronously working memory devices which are completely duplicated for reliability reasons, a difference on the comparison indicating a fault in one of the memory devices. The advantage of the two last-mentioned methods is that the supervision of faults is executed by means of the information used for the process control, the respective supervision arrangement being connected to a word register, to which the information words are transferred from an addressed memory element group in connection with reading operations belonging to the process control. However, the two last-mentioned methods have the disadvantage that the above described hidden faults are not detected as long as the state which is recorded when writing is that which the respective memory element is capable of indicating during the reading operations. If the memory device for example stores a program which during a long time remains unchanged the danger is great that a hidden fault is present the whole time, but only appears when there is a program reorganization which results in a shut down or at least in a reduction of reliability. These results could have been avoided if the fault had been detected earlier and repaired during a working pause or a period with low working activity.

An object of the invention is to avoid all the above mentioned disadvantages by quickly detecting hidden faults without using information especially intended for test routines.

Figure 3:
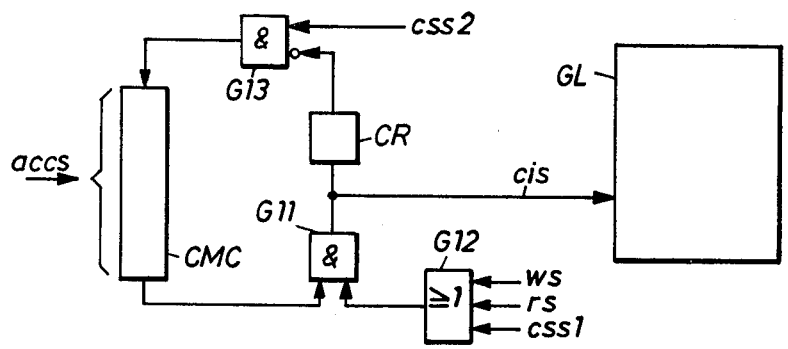
Figure 4:
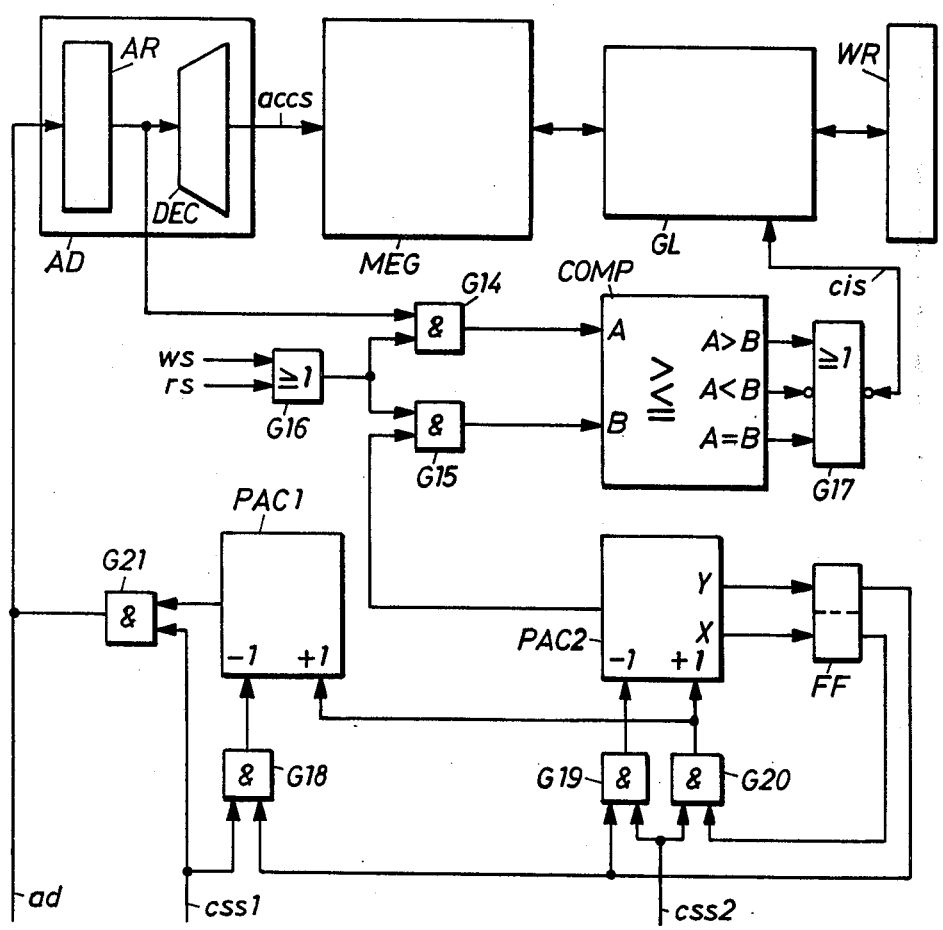

The characteristics of the method and apparatus according to the invention appear from the claims. The method and the apparatus will henceforward be explained referring to the accompanying drawing in which FIG. 1 shows a block diagram with the computer parts concerning the invention, in FIG. 2 shows a category application logic array, and in FIGS. 3 and 4 shows category transmitters and associated category shift devices.

FIG. 1 shows how a logical arrangement, in order to apply two memory element categories, henceforth called category application logic CAL, is connected to the rest known parts of a computer DM. An addressing device AD receives from the computer calculated addresses on line ad and produces access signals on line accs by which memory element groups MEG are accessed. Information words WR received from the computer in connection with a writing operation are temporarily stored in a word register WR before being transferred to one of the element groups, and during a reading operation information words received from one of the element groups are also stored in the word register WR before transfer to the computer for further processing. A supervision device SD is connected to the word register and it is assumed in the following that the supervision is executed according to the known parity principle. An alarm signal is sent on line als to the computer DM if the word register temporarily stores an incorrect information word. A faulty memory element group is detected if an information word which is read therefrom is incorrect.

Generally, it is impossible to carry out a reading operation without erasing from the selected memory element group the respective number of binary bits containing information word i.e., the readout is destructive. In a dynamic semiconductor memory, for example, a discharge pulse or no pulse is obtained if the respective element had a charged or a discharged state, and after the reading the whole memory element group will be in the discharged state. In order to achieve a permanent storing, the reading operation comprises therefore in addition to the actual reading phase, a subsequent writing phase in order to re-write the information word originated during the reading phase. To obtain uniform access cycles, the writing operation as well comprises often a reading phase which precedes the actual writing phase. Hereby, it is possible to use previously stored information word for supervision purpose. Thus, both the reading and writing operations belonging to the data processing for the process control are amenable to fault detections It is a well known computer technique to make suitable phase sequences for information transferring between the computer and the memory element groups. Of that technique, the block diagram in FIG. 1 shows only that the memory element groups receive writing signals on line ws and reading activation signals on line rs, respectively. The information words are transferred from the word register WR to a selected memory element group and vice versa through the category application logic CAL. In addition, logic CAL is connected to the addressing device AD and also receives the above mentioned writing and reading activation signals on lines ws, rs as well as category shift signals on line css from computer DM as will be described below.

Figure 2:
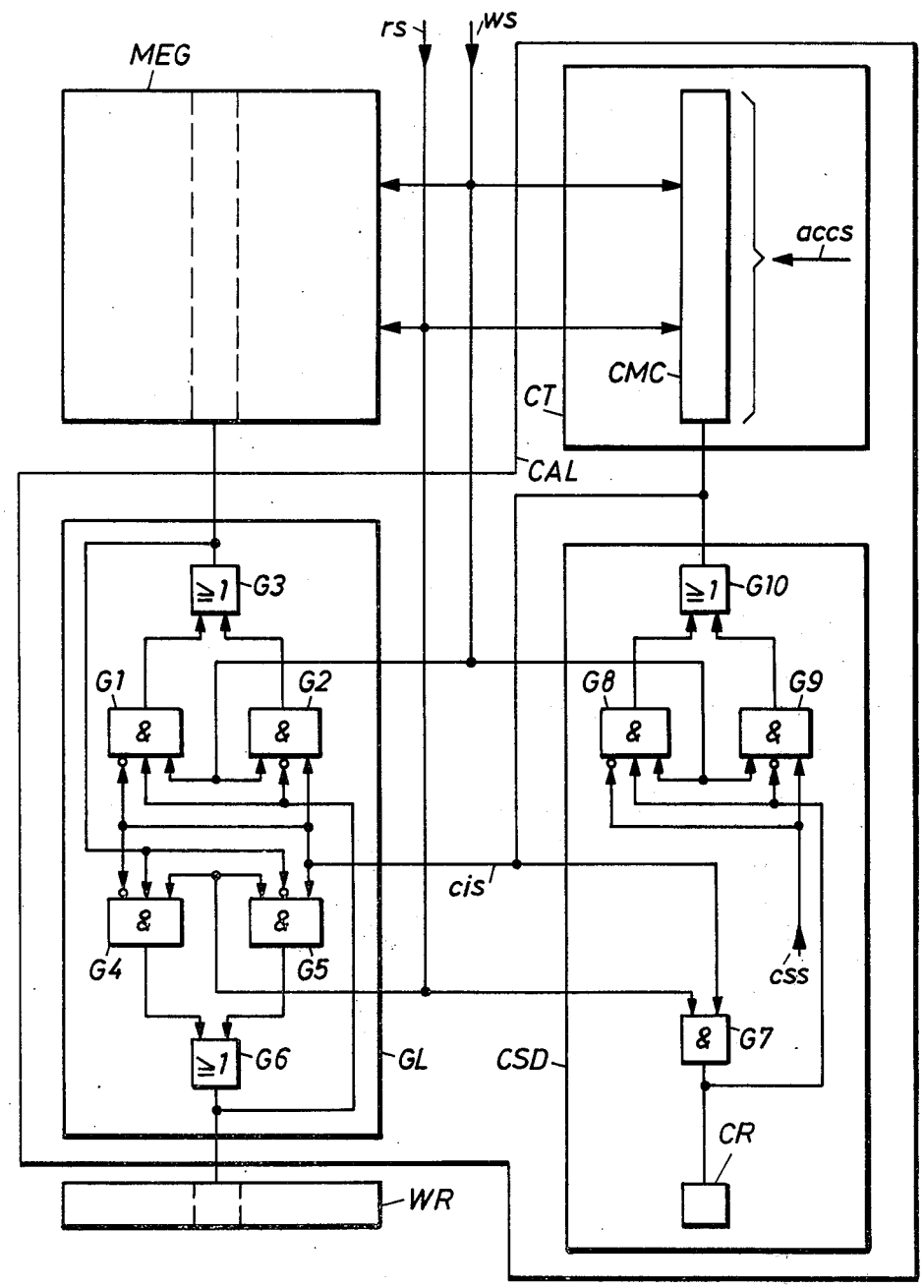

FIG. 2 shows that the category application logic CAL comprises a gate logic GL, a category shift device CSD and a category transmitter CT in order to indicate to which of the said two categories a selected memory element group belongs.

In FIG. 2, the gate logic GL is simplified so that only the gates which control the transfer of one bit of the information words are shown. Corresponding gate equipments arranged for the remaining bits are not shown. The bit is transferred from the word register WR to the respective element in the memory element group MEG via gates G1 to G3, and is transferred in reversed direction via gates G4 to G6. The gates G1, G2, G4 and G5 execute AND-functions. The gates G3 and G6 execute OR-functions. The gates G1 and G2 have their ouputs connected to respective inputs of the gate G3. The gates G4 and G5 have their outputs connected to respective inputs of the gate G6. The gates G2 and G5 are provided with inverting inputs connected to the word register WR memory and memory element group MEG, respectively.

Which of the AND-gates is activated depends on the writing and reading activation signals on lines ws, rs respectively and on a category indication signal on lines cis received from the category transmitter CT. According to the embodiment chosen in FIG. 2 gate G1 and gate G4 respectively are activated during a writing and a reading phase respectively if the category transmitter indicates the first category by sending a binary "0". Gate G2 and gate G5 respectively are activated if the category transmitter indicates the second category by sending a binary "1". If an element group belongs to the first category the bits of the information word are transferred in unchanged binary form via gate G1 or G4 to or from the respective memory element. If an element group belongs to the second category, the gates G2 and G5 carry out inversions, the inversion upon reading cancelling the inversion upon writing. An information word is therefore registered in the word register after the reading in the same form as before the writing, independent of the category indicated by the category transmitter, but on the absolute condition that, when reading, the category is the same as it has been when writing the respective information word. However, data processing is not disturbed if a category shift is carried out by means of the category shift device CSD directly before a writing, irrespective of whether the respective writing phase is included in a reading operation or in a writing operation. Furthermore, the category of an element group may be shifted and its binary contents may be inverted by means of executing at an arbitrary time beside the normal data processing the following sequence of operations: "(1.) Reading operation, which only consists of a reading phase, whereby the respective information word in correct form is registered in the word register. (2.) Shifting of the binary contents of the respective category indication signal. (3.) Writing operation, which only consists of a writing phase, whereby the respective information word is rewritten." Such operation sequences are introduced in order to force regular category shifts by, for example cyclically addressing the memory element groups. By means of these category shifts the hidden faults explained in the introduction are detected even if the memory device is used to store a program unchanged for a long time and even if some memory element groups are accessed relatively seldom due to the normal process control.

The category transmitter shown in FIG. 2 comprises a category memory column CMC, the elements of which are selected by means of the access signals on line accs and are activated for reading and writing respectively by means of reading and writing activation signals on lines rs, ws respectively. Each of the writing and reading operations of the process control is assumed to comprise a reading-writing phase sequence which is executed in both the memory element groups and the category memory column.

The category shift device shown in FIG. 2, comprises a category register CR which receives and transmits respectively category indication signals on lines cis from and to respectively the category memory column CMC via gates G7 to G10, which control the transfer of category indication signals similar to the gate logic GL which controls the transfer of information words. However, as the category indication signals never are to be inverted when reading from the category memory column, this reading is controlled by means of only one AND-gate G7 which is activated by the reading activation signals on line rs. Upon writing in the category memory column, the category indication signals are transferred from the category register CR via one of the AND-gates G8 and G9 which receive writing activation signals on line ws. It is assumed that the category will be shifted and remain unchanged respectively in connection with writing phases during which the category shift device receives from the computer a binary "1" and a binary "0" respectively as a category shift signal on line css. Via gate G8 which is activated by "0" shift signal, the category indication signal is transferred unchanged. A category shift is achieved due to an inversion of the category indication signal via gate G9, which is activated by a "1" shift signal on line. The category indication signal cis, coming from the category memory column during a reading phase and coming from the OR-gate G10 during a writing phase, is fed to the gate logic GL. The above mentioned operation sequence, in order to shift the category as well as the data processing for the process control is made at an arbitrary instant by means of a reading-writing phase sequence combined with a binary "1" as the category shift signal.

In a simplified embodiment, the category is. In principle, shifted at every writing phase, in this case the category shift signals, AND-gate G8 and OR-gate G10 are superfluous. A constructively advantageous modification is obtained if the category memory column, the category register and the gates G7 to G10 respectively constitute parts of the memory element groups, the word register and the gate logic respectively.

FIG. 3 shows an embodiment which for category indication and category shift comprises a category memory column CMC receiving said access signals on a line accs, a category register CR and gates G11 to G13. This embodiment is for static memory elements in the memory element groups and in the category memory column, i.e. that the stored binary contents are not erased in connection with a reading and that the writing and reading operations solely consist of writing and reading phases, respectively. The category memory column is hereby activated for reading to the gate logic GL described in connection with FIG. 2 and to the category register by means of an AND-gate G11. Gate G11 is connected to the output at an OR-gate 12, which is activated by a writing activation signal on line ws, a reading activation signal on line rs or a first category shift signal on line css1. Observing the above-mentioned general rules valid for category shifts, in a shift the category indication signal is stored before the shift is transferred by means of the first shift signal on line css1 to the category register CR. Furthermore, the shift comprises the activation of an AND-gate G13 by means of a second category shift signal on line css2 and by that the activation of the category memory column CMC for writing in the inverted contents of the category register. The inversion is made for example by means of an inverting input gate G13.

FIG. 4 shows a category application of logic an embodiment that is suitable if the category shifts are carried out only in addition to the data processing, for the process control within the above mentioned operation sequences which guarantee cyclically returning regular category shifts to the memory element groups. In order to carry out these operation sequences and to produce category indication signals on line cis during the normal process control, this embodiment comprises, besides the gate logic GL described in connection with FIG. 2 a first partition address counter PAC1 whose contents are transferred to the addressing device AD of the memory element groups and which comprises a magnitude comparator COMP having inputs connected to the addressing device and to a second partition address counter PAC2. Comparator COMP is of a known type which, for example is defined by means of the designation "7485" published by "Joint Electron Device Engineering Counsil" (JEDEC), and emits an output signals indicating that of two received numbers the one, compared with the other, is larger, smaller or equal. Both of the counters are of known type, which for example is defined by means of the designation "74193" given by the US Standards Committee JEDEC, and are provided with a stepping-up input +1 and a stepping-down input −1 whereby the counter contents are increased and decreased respectively with one counter unit due to an activation signal supplied to the respective input. During the normal process control the first and second counters contain a corresponding partition address number pad. If min and max respectively are the smallest and the biggest occurring address numbers respectively for the memory element groups MEG, min ≦ pad ≦ max+1 is used as a partition address number, which, due to a writing or a reading activation signal ws, rs is compared by means of the comparator COMP, two AND-gates G14, G15 or an OR-gate G16 with the address number ad actual for the process control and registered in an address register AR associated with the addressing device. The outputs of the comparator are so connected to an OR-gate G17 that its inverting output produces a binary "0" indicating the first category if the address number in question is equal to or larger than the partition address number, and produces respectively a binary "1" indicating the second category if the address number in question is smaller than the partition address number. If the counters contain the partition address number pad=min and pad=max+1 respectively, all the memory element groups belong to the first and the second category respectively.

Second counter PAC2 is provided with output X and Y which are activated owing to the counter contents min and max+1 respectively. Said outputs X and Y are connected to a bistable flip-flop FF, which, together with the three AND-gates G18, G19, G20 controls the stepping of the two counters so that a first and a second category shift signal on lines css1, css2 respectively activates the stepping-down input −1 of the first and second counter respectively if the state of the flip-flop is due to an activation of the output Y, and so that the second category shift signal on line css2 activates the stepping-up inputs +1 of the two counters if the state of the flip-flop is due to an activation of said output X. By such a stepping control, an above mentioned operation sequence is obtained, if the computer sends a first category shift signal on line css1, a reading activation signal on line rs, a second category shift signal on line css2 and a writing activation signal ws one after the other.

The phases of an operation sequence imply, if both of the counters are in a stepping-up condition and contain the partition address number pad=n:

1. Owing to the first shift signal on line css1, the number n is transferred via an activated AND-gate G21 to the address register AR of the addressing device.

2. Owing to reading activation signal one line rs the information word selected by means of the address number ad=n and by means of a decoder DEC is transferred to the word register WR via the gate logic GL which receives an "0" as category indication signal on line cis because the comparator COMP is fed at both inputs with the number n.

3. Owing to the second shift signal on line css2 the two counters are stepped up to the contents n+1.

4. Owing to the writing activation signal on line ws the information word temporarily stored in the word register WR is transferred back to the memory element group, selected by means of the address number n, via the gate logic which receives a "1" as indication signal, because the comparator calculates that the number n registered in the address register is smaller than the number n+1 received from the counter PAC2.

Said phases of an operation sequence imply, if both of the counters are in a stepping-down condition and contain the partition address number pad=n+1:

1. Owing to the first shift signal on line css1 the first counter PAC1 is stepped down to the number n, which is transferred to the address register AR.

2. Owing to the reading activation signal on line rs the information word selected by means of the address number n is transferred to the word register, the gate logic receiving a "1" as indication signal, because the comparator calculates that the number n registered in the address register is smaller than the number n+1 received from the counter PAC2.

3. Owing to the second shift signal on line css2 the second counter PAC2 is stepped down to the partition address number n.

4. Owing to the writing activation signal on line *ws* the information word is transferred back to the memory element group selected by means of the address number *n*, the gate logic receiving an "0" as category indication signal because the comparator is fed at both inputs with the number *n*.

We claim:

1. In a memory device which includes addressable memory element groups for storing binary coded information words and a word register for temporarily storing information words which are transferred to the memory element groups during a writing phase and from the memory element groups during a reading phase wherein a fault in a memory element group is indicated if an incorrect word is registered in the word register as the result of, during a reading phase, the transfer of the information word in said memory element group to the word register, the method of detecting faults comprising the steps of assigning some of the memory element groups to a first category, assigning other of the memory element groups to a second category, transferring in unchanged form information words between the word register and the memory element groups of the first category, transferring in binary complement form information words between the word register and the memory element groups of the second category, and changing at times the category assignments of the memory element groups.

2. The method of claim 1 wherein the changing of category assignment step comprises addressing one of the memory element groups during a reading phase so that the information word stored in the addressed memory element group is transferred to the word register, then changing category assignment of the addressed memory element group, and during a writing phase returning the information word stored in the word register to said addressed memory element group.

3. The method of claim 1 wherein the changing of category assignment of a memory element group occurs with a writing phase associated with said memory element group.

4. In a computer having addressable memory element groups for storing binary coded information words, a word register for temporarily storing an information word which is transferred to an addressed memory element group during a writing phase and which is transferred from an addressed memory element group during a reading phase, and error detecting means for detecting errors in words temporarily stored in the word register, category application logic for assigning a first category to some of the memory element groups wherein an information word is transferred unchanged between these memory element groups and the word register and for assigning a second category to others of the memory element groups wherein an information word is transferred in binary complement form between these memory element groups and the word register, said category application logic comprising a category transmitter means for emitting actual category indicating signals indicating which of the two categories an addressed memory element groups belongs, gate logic means connecting the word register to the addressed memory element groups and responsive to the actual category indicating signals for controlling whether an information word is transferred between the word register and an addressed memory element group in binary complemented form or unchanged, category changing means for changing at times in response to category shift signals the category assignments of the addressed memory element groups, and means for generating the category shift signals.

5. The category application logic of claim 4 wherein said category transmitter means comprises addressable memory elements each associated with one of the memory element groups, each of said memory elements storing the actual category indicating signal of the associated group, and said category changing means comprises a category register for temporarily storing an actual category indicating signal for one of said addressable memory elements, and means response to a category signal for binary complementing the signal stored in category register before transfer to said one memory element.

6. The category application logic of claim 4 wherein said category transmitter means comprises an up-down counter means for generating partition addresses, a magnitude comparator means for generating an actual category indicating signal depending on the relative magnitudes of the generated partition address and the address of a selected memory element group, and said category changing means comprises means for incrementing or decrementing said up-down counter means in response to the category shift signals.

* * * * *